(12) United States Patent
Shitou

(10) Patent No.: US 9,196,686 B2
(45) Date of Patent: Nov. 24, 2015

(54) DIODE CIRCUIT AND DC TO DC CONVERTER

(71) Applicant: KABUSHIKI KAISHA TOSHIBA, Tokyo (JP)

(72) Inventor: Yoshihiro Shitou, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/176,633

(22) Filed: Feb. 10, 2014

(65) Prior Publication Data

US 2015/0053994 A1 Feb. 26, 2015

(30) Foreign Application Priority Data

Aug. 22, 2013 (JP) ................. 2013-172354

(51) Int. Cl.
*H01L 29/76* (2006.01)
*H01L 29/20* (2006.01)
*H01L 29/778* (2006.01)
*H01L 29/861* (2006.01)
*H01L 27/06* (2006.01)

(52) U.S. Cl.
CPC ........ *H01L 29/2003* (2013.01); *H01L 27/0605* (2013.01); *H01L 29/778* (2013.01); *H01L 29/7787* (2013.01); *H01L 29/861* (2013.01)

(58) Field of Classification Search
CPC ............ H01L 27/0255; H01L 29/6603; H01L 29/6609
USPC ............................................. 257/288, E27.05
See application file for complete search history.

(56) References Cited

U.S. PATENT DOCUMENTS

| | | | |
|---|---|---|---|
| 5,105,090 A * | 4/1992 | Miyajima et al. | 250/551 |
| 2008/0230834 A1* | 9/2008 | Akagi et al. | 257/337 |
| 2013/0299841 A1* | 11/2013 | Ranglack et al. | 257/76 |

FOREIGN PATENT DOCUMENTS

JP 2008198735 A 8/2008

* cited by examiner

*Primary Examiner* — Tan N Tran
(74) *Attorney, Agent, or Firm* — Patterson & Sheridan, LLP

(57) ABSTRACT

A diode circuit includes a switching element having a first terminal and a second terminal. The switching element includes a control electrode for controlling electrical conductance between the first and second terminals. A diode has a cathode electrode connected to the first terminal of the switching element and an anode electrode connected to the control electrode of the switching element. An impedance element is connected in parallel to the diode. The switching element and the diode each comprise a gallium nitride-based semiconductor component. The switching element and the diode may optionally be disposed on the same semiconductor substrate. The diode circuit may optionally be included in a direct current to direct current converter device or other devices.

10 Claims, 6 Drawing Sheets

DIODE CIRCUIT AND DC TO DC CONVERTER

CROSS-REFERENCE TO RELATED APPLICATION

This application is based upon and claims the benefit of priority from Japanese Patent Application No. 2013-172354, filed Aug. 22, 2013, the entire contents of which are incorporated herein by reference.

FIELD

Embodiments described herein relate generally to a diode circuit and a DC to DC converter using a gallium nitride based semiconductor.

BACKGROUND

SiC and GaN have attracted attention as semiconductor materials for replacing silicon in semiconductor devices. Both SiC and GaN have bandgaps larger than that of silicon and thus have higher breakdown voltages. Therefore, SiC and GaN can be used to manipulate low on-resistance devices. For this reason, research and development of GaN-based devices is being conducted.

For GaN-based devices, it is difficult to form p-type layers having appropriate characteristics in the GaN material by ion implantation. However, if a high electron mobility transistor (HEMT) structure is used, it is possible to decrease the on-resistance of GaN and use GaN-based components to manipulate devices capable of high-frequency operations.

In designing a high breakdown voltage DC to DC converter using a GaN-HEMT, a diode using a GaN semiconductor material (hereinafter such a diode may be referred to simply as a GaN-Di) is necessary.

However, there is a problem that the leakage current of a GaN-Di during application of a reverse bias can be larger than the leakage current of a GaN-HEMT. Also, a GaN-Di is often formed as a lateral structure, but if a GaN-Di is formed in a lateral structure, the on-resistance generally increases. Therefore, the forward voltage increases and power loss increases.

DETAILED DESCRIPTION

In an example embodiment, a diode circuit and a DC to DC converter in which on-resistances during application of a forward bias are low and leakage currents during application of a reverse bias are small is described.

In general, according to one embodiment, a diode circuit includes a switching element having a first terminal and a second terminal. The switching element may be, for example, a high electron mobility transistor device. The switching element includes a control electrode for controlling electrical conductance between the first and second terminals. A diode in the diode circuit has a cathode electrode connected to the first terminal of the switching element and an anode electrode connected to the control electrode of the switching element. An impedance element is connected in parallel to the diode. The switching element and the diode each comprise a gallium nitride-based semiconductor component. The switching element and the diode may optionally be disposed on the same semiconductor substrate. The diode circuit may optionally be included in a direct current to direct current converter device or other semiconductor device.

Hereinafter, embodiments will be described with reference to the accompanying drawings.

Figure 1:
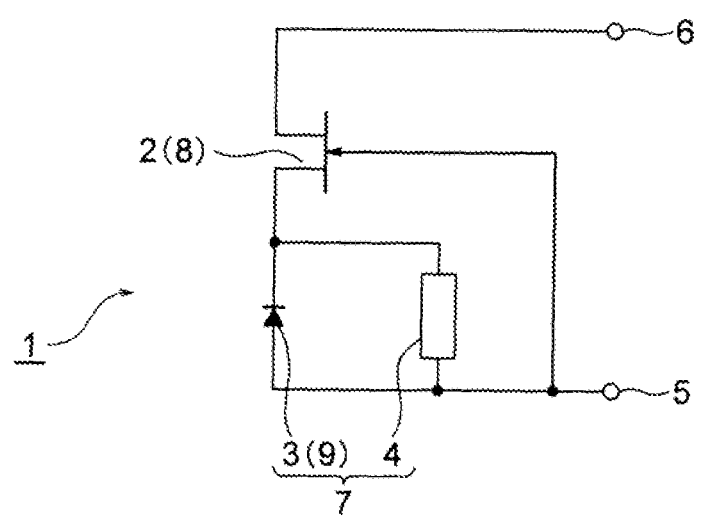
FIG. 1 is a circuit diagram illustrating a diode circuit according to an embodiment.

FIG. 1 is a circuit diagram illustrating a diode circuit 1 according to an embodiment. The diode circuit 1 includes a switching element 2, a diode 3, an impedance element 4, a first signal transmitting unit 5, and a second signal transmitting unit 6. The diode 3 and the impedance element 4 are connected in parallel, thereby constituting a parallel circuit 7. The parallel circuit 7 and the switching element 2 are connected in series between the first signal transmitting unit 5 and the second signal transmitting unit 6.

The switching element 2 and the diode 3 are made of a gallium nitride based semiconductor. Hereinafter, an example in which the switching element 2 is a HEMT formed using GaN and the diode 3 is a diode formed using GaN will be described. To indicate an embodiment wherein the switch element 2 is a HEMT formed using GaN, the switching element 2 may be referred to as a GaN-HEMT 8. In addition, to indicate an embodiment wherein the diode 3 is formed using a GaN, the diode 3 may be referred to as a GaN-Di 9.

The GaN-HEMT 8 and the GaN-Di 9 can be formed on a common substrate. Therefore, it is possible to form the GaN-HEMT 8 and the GaN-Di 9 in a single chip, if desired. The anode electrode of the GaN-Di 9, one end of the impedance element 4, and the gate of the GaN-HEMT 8 are connected to the first signal transmitting unit 5 (or a terminal connected or connectable thereto).

When a forward bias is applied to the diode circuit 1, the second signal transmitting unit 6 (or a terminal connected or connectable thereto) outputs a current flowing from the first signal transmitting unit 5 through either the diode 3 or the impedance element 4, and the GaN-HEMT 8.

The drain of the GaN-HEMT 8 is connected to the second signal transmitting unit 6, and the source of the GaN-HEMT 8 is connected to the cathode electrode of the diode 3 (which may be GaN-Di 9) and the other end of the impedance element 4.

Figure 2:
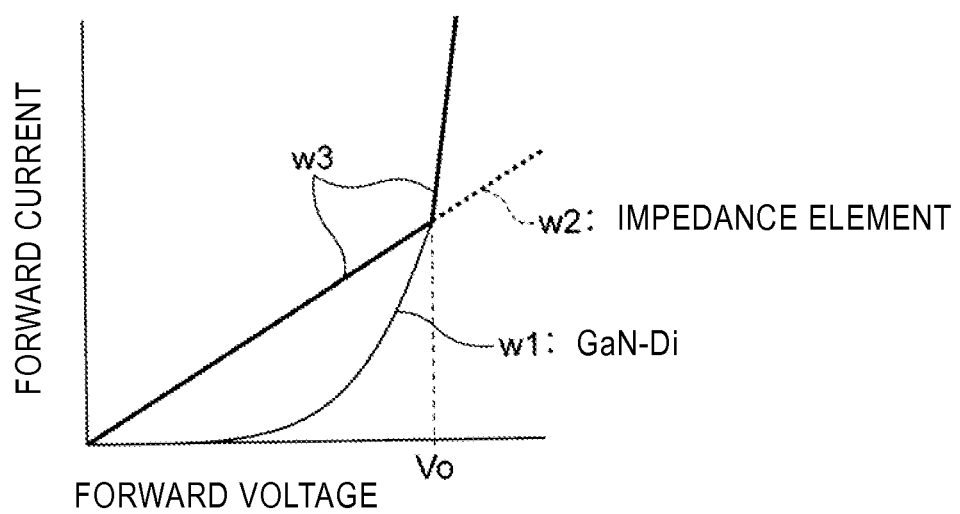
FIG. 2 is a graph illustrating a forward characteristic of a diode and a voltage-current characteristic of an impedance element.

FIG. 2 is a view illustrating the forward characteristic of the diode 3 and the voltage-current characteristic of the impedance element 4, and in FIG. 2, the horizontal axis represents forward voltage, and the vertical axis represents current. The forward characteristic of the diode 3 is expressed by a waveform w1, and the voltage-current characteristic of the impedance element 4 is expressed by a waveform w2. Also, the forward characteristic of the entire diode circuit 1 is expressed by a bold, solid line representing waveform w3.

Figure 3A:
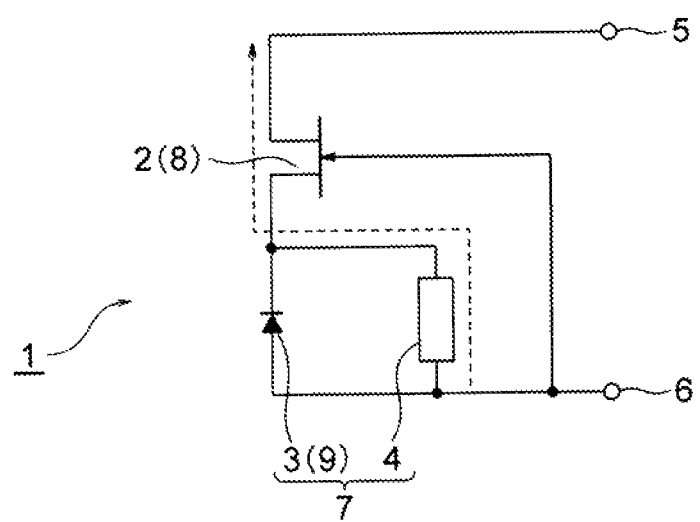
FIG. 3A depicts a current path when an applied voltage is lower than a predetermined voltage.

As can be seen from FIG. 2, when a voltage applied to the diode 3 and the impedance element 4 is lower than a predetermined voltage Vo, the impedance of the impedance element 4 is lower than that of the diode 3. Therefore, the current from the first signal transmitting unit 5 flows into the impedance element 4, not into the diode 3, as depicted in FIG. 3A.

Figure 3B:
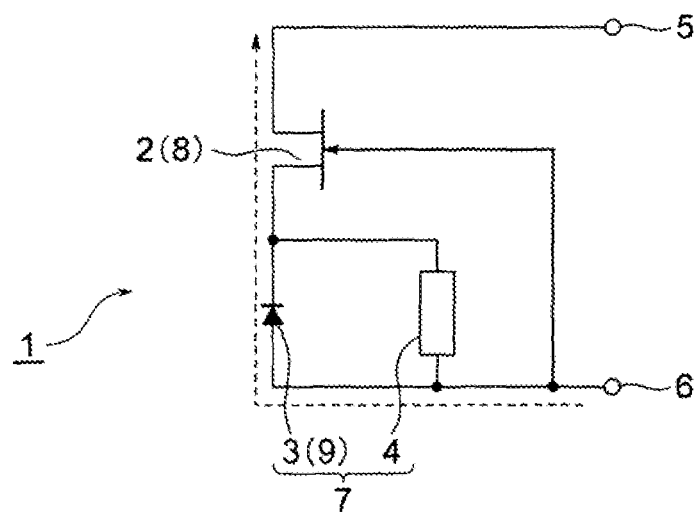
FIG. 3B depicts a current path when an applied voltage is equal to or higher than the predetermined voltage.

Meanwhile, when the voltage applied to the diode 3 and the impedance element 4 is equal to or higher than the predetermined voltage Vo, the impedance of the diode 3 is lower than that of the impedance element 4. Therefore, the current from the first signal transmitting unit 5 flows into the diode 3, not into the impedance element 4, as depicted in FIG. 3B. The diode 3 and the impedance element 4 have different impedance magnitudes (characteristics) depending on whether the applied voltage is lower than the predetermined voltage or not, the current from the first signal transmitting unit 5 flows through the element having the lower impedance, regardless of the applied voltage.

Therefore, the current flowing in the diode circuit 1 during application of a forward bias is not necessarily limited by the forward voltage characteristic of the diode 3, and thus it is possible to reduce the on-resistance and forward voltage of the diode circuit 1. Also, if the voltage applied to the diode 3 and the impedance element 4 becomes equal to or higher than the predetermined voltage, the impedance of the diode 3 becomes lower than that of the impedance element 4, and thus the current from the first signal transmitting unit 5 flows into the diode 3.

As described above, in the diode circuit 1 of FIG. 1, it is possible to always make the current flow into one of diode 3 and impedance element 4 regardless of the voltage applied to the diode 3 and the impedance element 4, and it is thus possible to reduce the on-resistance during application of a forward bias and the consequential power loss.

Meanwhile, during application of a reverse bias, the source voltage of the GaN-HEMT 8 (switch 2) becomes higher than the voltage of the first signal transmitting unit 5 by a voltage drop of the impedance element 4. Since the first signal transmitting unit 5 is connected to the gate of the GaN-HEMT 8, it is possible to always make the gate voltage of the GaN-HEMT 8 lower than the source voltage thereof. Therefore, it is possible to surely turn off the GaN-HEMT 8 to prevent a leakage current from flowing between the drain and source of the GaN-HEMT 8, and thus the leakage current characteristic is improved.

Figure 4:
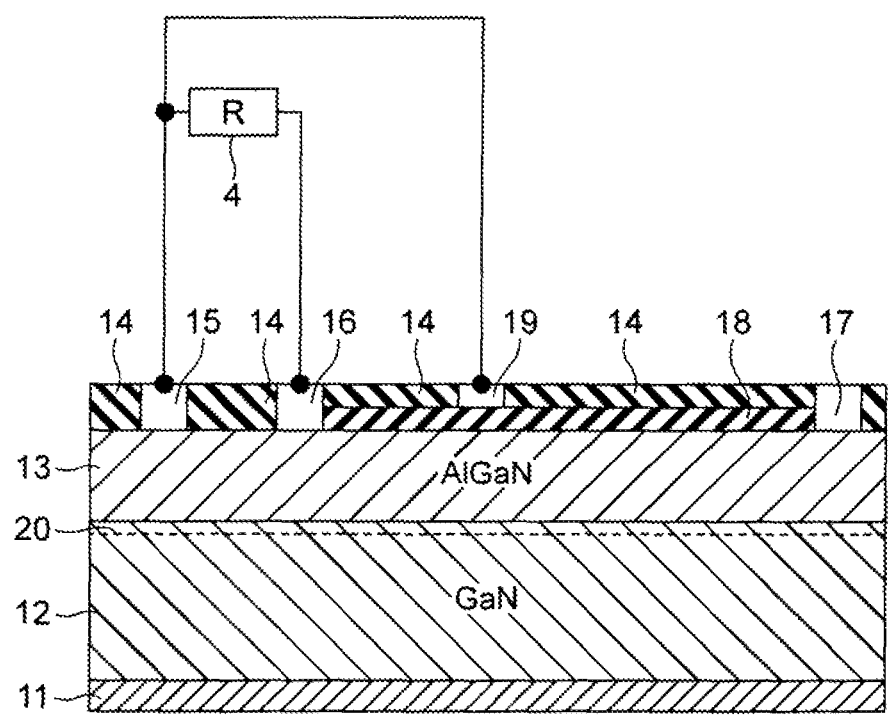
FIG. 4 is a cross-section structure of the diode circuit of FIG. 1.

FIG. 4 is a view illustrating the cross-section structure of the diode circuit 1, and shows an example in which the switching element 2 and the diode 3 are formed on a common substrate, so as to be a single chip. As the substrate, for example, a silicon substrate can be used.

The diode circuit 1 of FIG. 4 includes a GaN layer 12 formed on a substrate 11, an AlGaN layer 13 formed on the GaN layer 12, an anode electrode layer 15, a cathode electrode layer 16, and a drain electrode layer 17 formed in an insulating layer 14 on the AlGaN layer 13, and a gate electrode layer 19 formed on the AlGaN layer 13 with an insulating layer 18 interposed therebetween.

The diode circuit 1 of FIG. 4 has a lateral structure in which the electrode layers are disposed in the plane of the substrate 11. The impedance element 4 is depicted as formed above the anode electrode layer 15 and the cathode electrode layer 16 using a wiring layer interposed therebetween. The impedance element 4 may be formed using a semiconductor layer on the same chip as the diode 3 and switching element 3, or may be disposed separately and be connected to the electrode layers with bonding wires or the like.

If the AlGaN layer 13 is formed on the GaN layer 12 as shown in FIG. 4, a two-dimensional electron gas 20 is generated in the vicinity of the interface between the GaN layer 12 and the AlGaN layer 13, and the two-dimensional electron gas 20 causes carrier mobility to increase. As a result, a high-frequency operation becomes possible.

Figure 5:
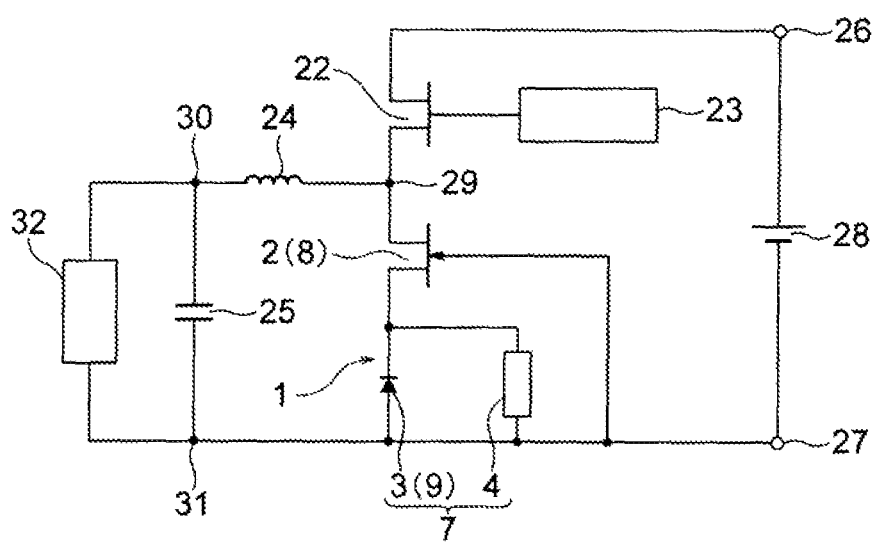
FIG. 5 is a circuit diagram illustrating a DC to DC converter using the diode circuit of FIG. 1.

FIG. 5 is a circuit diagram illustrating a DC to DC converter 21 using the diode circuit 1. The DC to DC converter 21 depicted in FIG. 5 includes the diode circuit 1, a high-side switch 22, a driving unit 23, an inductor element 24, and an output capacitor 25.

The high-side switch 22 and the diode circuit 1 are connected in series between a first input node 26 and a second input node 27 to which an input voltage of about 600 V is applied. The input voltage is generated by an input power source 28 connected to the first input node 26 and the second input node 27.

The anode electrode of the diode 3 is connected to the second input node 27, and the drain of the GaN-HEMT 8 is connected to the source of the high-side switch 22. The drain of the high-side switch 22 is connected to the first input node 26, and the gate of the high-side switch 22 is connected to the driving unit 23.

One end of the inductor element 24 is connected to a connection node (intermediate node) 29 between the high-side switch 22 and the diode circuit 1, and the other end of the inductor element 24 is connected to a first output node 30. The output capacitor 25 is connected between the first output node 30 and a second output node 31. The second input node 27 and the second output node 31 have the same potential, and may be set to, for example, a ground potential.

The high-side switch 22 is, for example, a GaN-HEMT. If the high-side switch 22 is composed of a GaN-HEMT, the high-side switch 22 can be paired with the GaN-HEMT 8 of the diode circuit 1, and thus a high-speed operation becomes possible.

The operation of the DC to DC converter 21 of FIG. 5 will be described. The driving unit 23 periodically turns on or off the high-side switch 22. When the high-side switch 22 is on, the current from the input power source 28 flows into the inductor element 24 and the output capacitor 25 through the drain and source of the high-side switch 22. At this time, the current from the input power source 28 does not flow into the diode circuit 1 because diode circuit 1 is reverse biased such that the cathode voltage of the diode 3 becomes higher than the anode voltage. This means that the source voltage of the GaN-HEMT 8 is higher than the gate voltage thereof, and the GaN-HEMT 8 is surely turned off such that a leakage current is prevented from flowing into the diode circuit 1.

When the high-side switch 22 is off, the current flows from the second input node 27 to the inductor element 24 and the capacitor element 25 through the diode circuit 1. As shown in FIG. 2, the current flowing into the diode circuit 1 passes through one of the impedance element 4 and the diode 3 according to whether the voltage between ends of the parallel circuit 7 is lower than the predetermined voltage or not.

Even when the high-side switch 22 is off, since a high voltage of 600 V is applied to the drain of the high-side switch 22, there is no possibility that the current flowing from the second input node 27 to the diode circuit 1 will flow in the high-side switch 22.

As described above, the high-side switch 22 is alternately turned on or off. In either case (high-side switch 22 is on or the high-side switch 22 is off), the currents flowing in the inductor element 24 and the output capacitor 25 are always in a constant direction, and thus it is possible to supply a DC voltage to a load 32.

Also, in a period when the high-side switch 22 is on, there is no possibility that a current flowing between the drain and source of the high-side switch 22 will leak into the diode circuit 1, and thus it is possible to reduce a power loss. Further, in a period when the high-side switch 22 is off, since it is possible to drive the diode circuit 1 in low impedance, it is possible to reduce a loss caused by a voltage drop in the diode circuit 1.

The diode circuit 1 and the DC to DC converter 21 according to the present embodiment can cope with a high voltage input, and thus can be used for a variety of purposes, such as a power supply for industrial use.

As described above, the diode circuit 1 according to the present embodiment is configured by connecting the parallel circuit 7 composed of the diode 3 and the impedance element 4 to the GaN-HEMT 8 (switching element 2). Therefore, the diode circuit 1 according to the present embodiment can make the current flow through the one of the diode 3 and the impedance element 4 having a lower impedance during application of a forward bias, and can reduce the on-resistance during application of a forward bias, thereby suppressing a loss caused by a voltage drop. Also, in the diode circuit 1 according to the present embodiment, during application of a reverse bias, since the source voltage of the GaN-HEMT 8 becomes higher than the gate voltage thereof, it is possible to reliably turn off the GaN-HEMT 8, and it is thus possible to suppress a leakage current flowing between the drain and source of the GaN-HEMT 8.

Also, if the diode circuit 1 according to the present embodiment is assembled in the DC to DC converter 21, a DC to DC converter 21 with little power loss capable of a high-speed operation may be obtained.

While certain embodiments have been described, these embodiments have been presented by way of example only, and are not intended to limit the scope of the disclosure . Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A direct current to direct current converter, comprising:
   a first switching element having a first terminal, a second terminal, and a control electrode;
   a diode having a cathode electrode connected to the first terminal of the first switching element and an anode electrode connected to the control electrode of the first switching element;
   an impedance element that is connected in parallel to the diode;
   a second switching element comprising a third terminal, a fourth terminal, and a second control electrode, the third terminal connected to the second terminal; and
   an inductor element provided between a capacitor element and the second terminal of the first switching element, the capacitor element connected to the anode electrode of the diode, wherein
   the first switching element and the diode each comprise a gallium nitride-based semiconductor component.

2. The direct current to direct current converter according to claim 1, wherein the second control electrode is connected to a driving unit.

3. The direct current to direct current converter according to claim 2, wherein the driving unit switches an electrical conductance between the third and fourth terminals between an on state and an off state.

4. The direct current to direct current converter according to claim 1, wherein the fourth terminal and the anode electrode of the diode are connected to a power source.

5. The direct current to direct current converter according to claim 1, wherein the first switching element and the second switching element are each comprised by a high electron mobility transistor.

6. The direct current to direct current converter according to claim 1, wherein the first switching element and the diode are disposed on a common substrate.

7. The direct current to direct current converter according to claim 6, wherein the impedance element is disposed on a substrate that is not the common substrate.

8. The direct current to direct current converter according to claim 1, wherein the second switching element is comprised by a gallium nitride-based high electron mobility transistor.

9. A semiconductor device, comprising:
   a first switching element that is a gallium nitride-based high electron mobility transistor having a source terminal, a drain terminal, and a gate electrode;
   a gallium nitride-based diode having a cathode electrode connected to the source terminal of the first switching element and an anode electrode connected to the gate electrode of the first switching element;
   an impedance element that is connected in parallel to the gallium nitride-based diode;
   a second switching element that is a gallium nitride-based high electron mobility transistor having a source terminal connected to the drain terminal of the first switching element; and
   an inductor element provided between the source terminal of the second switching element and a capacitor element, the capacitor element connected to the anode of the gallium nitride-based diode.

10. The semiconductor device according to claim 9, wherein the first switching element and the gallium nitride-based diode are disposed on a common substrate.

* * * * *